(12) United States Patent
Simpson

(10) Patent No.: US 7,642,938 B2
(45) Date of Patent: Jan. 5, 2010

(54) GRAY CODE TO SIGN AND MAGNITUDE CONVERTER

(75) Inventor: Richard D. Simpson, Carlton (GB)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/028,469

(22) Filed: Feb. 8, 2008

(65) Prior Publication Data

US 2008/0191910 A1 Aug. 14, 2008

Related U.S. Application Data

(60) Provisional application No. 61/016,969, filed on Dec. 27, 2007.

(30) Foreign Application Priority Data

Feb. 9, 2007 (GB) ................. 0702575.2

(51) Int. Cl.
H03M 7/04 (2006.01)
(52) U.S. Cl. ........................... 341/97; 341/96
(58) Field of Classification Search .......... 341/155, 341/156, 131, 97, 98, 96
See application file for complete search history.

(56) References Cited

U.S. PATENT DOCUMENTS

| 4,039,948 A | * | 8/1977 | Boxall ..................... 370/533 |
| 4,733,220 A | | 3/1988 | Knierim |
| 5,459,466 A | * | 10/1995 | Knierim et al. ............. 341/160 |
| 5,757,234 A | | 5/1998 | Lane |
| 5,990,815 A | * | 11/1999 | Linder et al. ................ 341/131 |
| 6,617,986 B2 | * | 9/2003 | Connor et al. ................ 341/97 |

FOREIGN PATENT DOCUMENTS

| GB | 2 375 625 A | 5/2001 |
| JP | 11 088174 A | 3/1999 |

OTHER PUBLICATIONS

Kester, Walt; *MT-009: Data Converter Codes—Can You Decode Them?*; [*Analog Devices: D/A Converters: Digital to Analog Converters: Tutorial MT-009: Data Converter Code—Can You Decode Them?*]; May 21, 2007; 20 pgs. http://www.analog.com/en/content/0,2886,761%255F795%255F91285,00.html.

* cited by examiner

*Primary Examiner*—Brian Young
(74) *Attorney, Agent, or Firm*—Dawn V. Stephens; Wade James Brady, III; Frederick J. Telecky, Jr.

(57) ABSTRACT

The present invention relates to Gray Codes and their conversion to sign and magnitude representation. Gray codes are used in flash ADCs (analogue to digital converters), which convert an analogue waveform into a sampled binary value. This can be done via a thermometer code, and the present invention addresses the issue of the propagation of error due to an indeterminant thermometer code value. In particular the invention provides a Gray code to sign and magnitude converter arranged to produce for the bits of its output other than the sign bit the same code for the Gray codes that are the same distance from the boundary where the sign bit changes value when the Gray codes are arranged in order of their value.

19 Claims, 7 Drawing Sheets

GRAY CODE TO SIGN AND MAGNITUDE CONVERTER

This application claims priority under 35 U.S.C. 119(a) to GB Provisional Application No. 0702575.2 filed Feb. 9, 2007.

This application claims priority under 35 U.S.C. 119(e)(1) to U.S. Provisional Application No. 61/016,969 filed Dec. 27, 2007.

BACKGROUND OF THE INVENTION

The present invention relates to Gray Codes and their conversion to sign and magnitude representation.

Gray codes are used in flash ADCs (analogue to digital converters), which convert an analogue waveform into a sampled binary value. A known form of flash ADC is shown in FIG. 9. In this ADC 500 an analogue sample of waveform present at terminal 510 captured by sample and hold circuit 511 is input to the positive inputs of a set of typically $2^N-1$ comparators 502 (where N is an integer). The negative inputs of the comparators are respectively connected to taps between a chain of $2^N$ series connected resistors 503 connected between the supply voltages. The resulting outputs from the comparators 502 form a thermometer code with is being output by all the adjacent comparators (those nearer the bottom in FIG. 9) having reference voltages less than the voltage of the waveform and 0s where they are greater (those near the top). One of the comparators at the boundary between the 1s and 0s may have a reference voltage very close to that of the waveform and so the output of that comparator may take a long time to settle, or even not resolve into a 1 or a 0 remaining at an intermediate voltage, or be unstable switching between 1 and 0. The thermometer code is latched into a register 504 under the control of a clock signal CLK. This latching does not cure the instability in the thermometer code however, which can propagate through the register 504. Next the thermometer code is converted into an N-bit Gray code, which represents $2^N$ states, with a thermometer to Gray code logic block 505. (The Gray code therefore has fewer bits than the thermometer code.) The Gray code used is the "reflected" Gray code, which is the one in which to move from one code to the next the rightmost bit that can be changed while still producing a unique code. Since Gray codes have the property that successive values change by one bit, so the unstable bit of the thermometer code will only have a small effect on the value of the N-bit Gray code should the effects of its instability propagate through into the Gray code. Table 1 shows the corresponding values of the codes for the case N=4.

TABLE 1

| Thermometer Code | Gray Code | Binary Code | Signal level* |
|---|---|---|---|
| 111111111111111 | 1000 | 1111 | 15 |
| 011111111111111 | 1001 | 1110 | 14 |
| 001111111111111 | 1011 | 1101 | 13 |
| 000111111111111 | 1010 | 1100 | 12 |
| 000011111111111 | 1110 | 1011 | 11 |
| 000001111111111 | 1111 | 1010 | 10 |
| 000000111111111 | 1101 | 1001 | 9 |
| 000000011111111 | 1100 | 1000 | 8 |
| 000000001111111 | 0100 | 0111 | 7 |
| 000000000111111 | 0101 | 0110 | 6 |
| 000000000011111 | 0111 | 0101 | 5 |
| 000000000001111 | 0110 | 0100 | 4 |
| 000000000000111 | 0010 | 0011 | 3 |
| 000000000000011 | 0011 | 0010 | 2 |

TABLE 1-continued

| Thermometer Code | Gray Code | Binary Code | Signal level* |
|---|---|---|---|
| 000000000000001 | 0001 | 0001 | 1 |
| 000000000000000 | 0000 | 0000 | 0 |

*taking a unit interval between thermometer codes and the zero level to be binary code 0000.

The Gray code is latched into anther register 506 under the control of the clock signal CLK. The Gray code is then converted with a Gray code to binary logic block 507 to a binary value (also shown in Table 1) which is then latched into another register 508 under the control of the clock signal CLK.

A problem with this circuit occurs in high data rate applications. Here the instability in the Gray code can propagate beyond register 506 and cause a large change in the value represented by the binary value output from logic block 507, which can then be latched by register 508. The present invention, in its preferred examples, aims to reduce this problem.

SUMMARY OF THE INVENTION

According to the present invention in one aspect thereof there is provided a thermometer code to sign and magnitude code converter circuit comprising:

a thermometer code to Gray code converter having an a thermometer code input and a Gray code output, and a Gray code to sign and magnitude code converter having a Gray code input connected to the Gray code output of the thermometer code to Gray code converter and having sign bit and magnitude outputs.

BRIEF DESCRIPTION OF THE DRAWINGS

Examples of the invention will now be described with reference to the accompanying drawings, of which.

DETAILED DESCRIPTION OF THE PREFERRED EMBODIMENTS

A key challenge facing designers of high-bandwidth systems such as data-routers and super-computers is the requirement to transfer large amounts of data between ICs—either on the same circuit board or between boards. This data transmission application is called Serialisation-Deserialisation or "SerDes" for short. The present invention is useful in SerDes circuit and indeed was developed for that application. Nonetheless the invention may be used in other applications.

Analysis of typical backplane channel attenuation (which is around −24 dB) and package losses (−1 to −2 dB) in the presence of crosstalk predict that an un-equalized transceiver provides inadequate performance and that decision feedback equalization (DFE) is needed to achieve error rates of less than $10^{-17}$.

Traditional decision-feedback equalization (DFE) methods for SerDes receivers rely on either modifying, in analogue, the input signal based on the data history ["A 6.25 Gb/s Binary Adaptive DFE with First Post-Cursor tap Cancellation for Serial backplane Communications" R Payne et al *ISSCC* 2005; "A 6.4 Gb/s CMOS SerDes Core with feed-forward and Decision Feedback Equalization" M. Sorna et al *ISSCC* 2005; "A 4.8-6.4 Gb/s serial Link for Backplane Applications Using Decision Feedback Equalization" Balan et al *IEEE JSSC* November 2005.] or on having an adaptive analogue slicing level ["Techniques for High-Speed implementation of Non-linear cancellation" S. Kasturia *IEEE Journal on selected areas in Communications*. June 1991.] (i.e. the signal level at which the circuit decides whether the signal represents a 1 or a 0).

Figure 1:
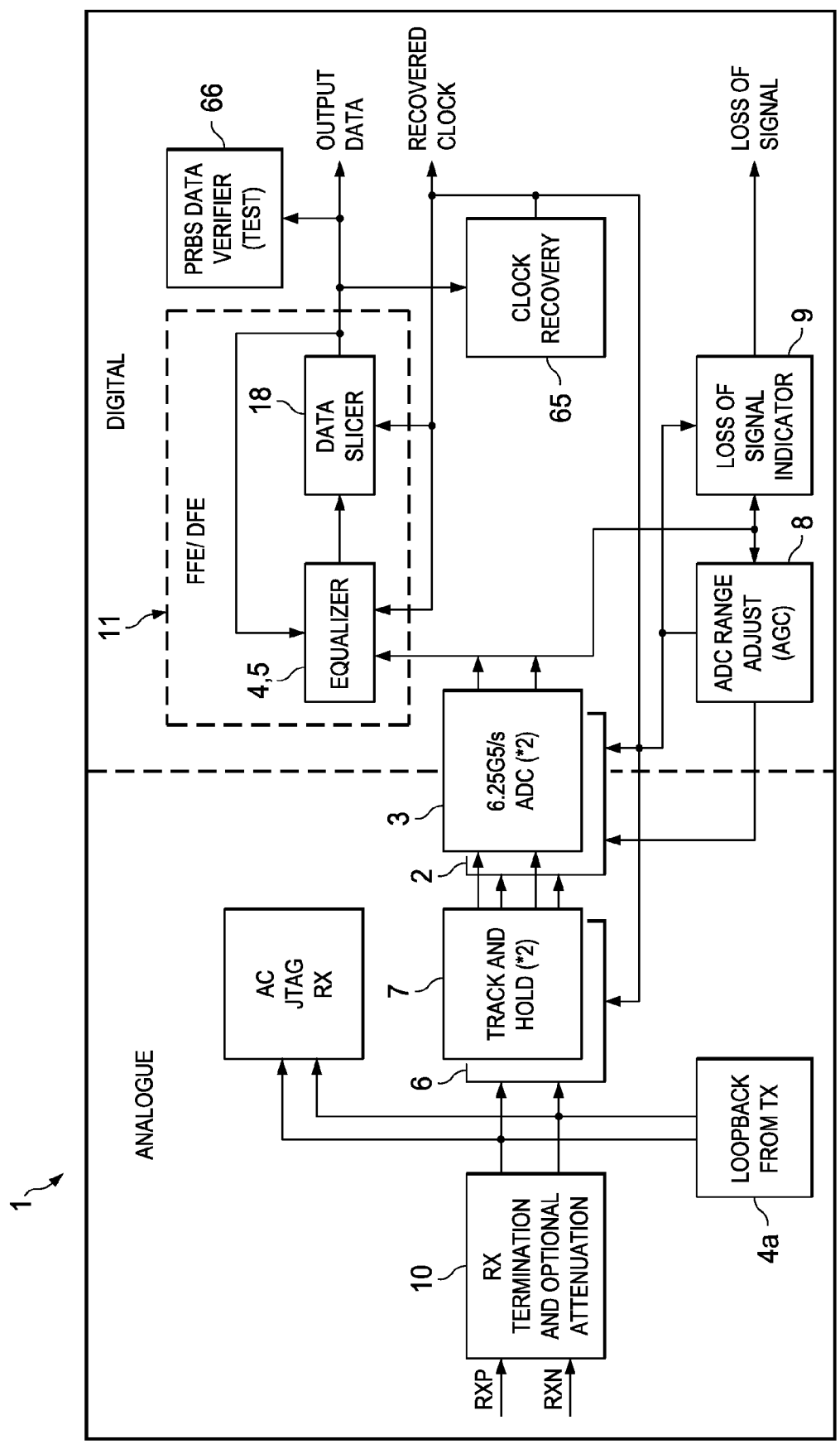
FIG. 1 is a block diagram a receiver circuit, in which the invention may be used.

A block diagram of a SerDes receiver circuit 1, which forms part of an integrated circuit, in which the present invention may be used is shown in FIG. 1. The invention may nonetheless be used in other applications.

In the receiver circuit 1 of FIG. 1 the input data is sampled at the baud-rate, digitized and the equalization and clock & data recovery (CDR) performed using numerical digital processing techniques. This approach results in the superior power/area scaling with process of digital circuitry compared to that of analogue, simplifies production testing, allows straightforward integration of a feed-forward equalizer and provides a flexible design with a configurable number of filter taps in the decision feedback equaliser. The circuit has been implemented in 65 nm CMOS, operating at a rate of 12.5 Gb/s.

The receiver circuit 1 comprises two baud-rate sampling ADCs (analogue to digital converters) 2 and 3, a digital 2-tap FFE (feed forward equaliser) 4 and digital 5-tap DFE (decision feedback equaliser) 5 to correct channel impairments.

The SerDes section of the integrated circuit, which includes the receiver circuit 1 is also provided with a transmitter 40 (FIG. 4), connected to transmit data over a parallel channel to that which the receiver circuit 1 is connected to receive data. The transmitter 40 comprises a 4-tap FIR filter to pre-compensate for channel impairments. In many applications the integrated circuit transmitting data to the receiver circuit 1 uses pre-compensation and in particular a similar transmitter circuit 40, but in other applications the receiver circuit 1 works without pre-compensation being used at the other end The receiver 1 of FIG. 1 is now described in more detail. The received data is digitized at the baud-rate, typically 1.0 to 12.5 Gb/s, using a pair of interleaved track and hold stages (T/H) 6 and 7 and a respective pair of 23 level (4.5 bit) full-flash ADCs 2 and 3 (i.e. they sample and convert alternate bits of the received analogue data waveform). The two track & hold circuits enable interleaving of the half-rate ADCs and reduce signal related aperture timing errors. The two ADCs, each running at 6.25 Gb/s for 12.5 Gb/s incoming data rate provide baud-rate quantization of the received data. The ADC's dynamic range is normalized to the full input amplitude using a 7-bit automatic gain control (AGC) circuit 8. A loss of signal indication is provided by loss of signal unit 9 that detects when the gain control signal provided by the AGC is out-of-range. An optional attenuator is included in the termination block 10, which receives the signals from the transmission channel, to enable reception of large signals whilst minimizing signal overload.

Figure 2:
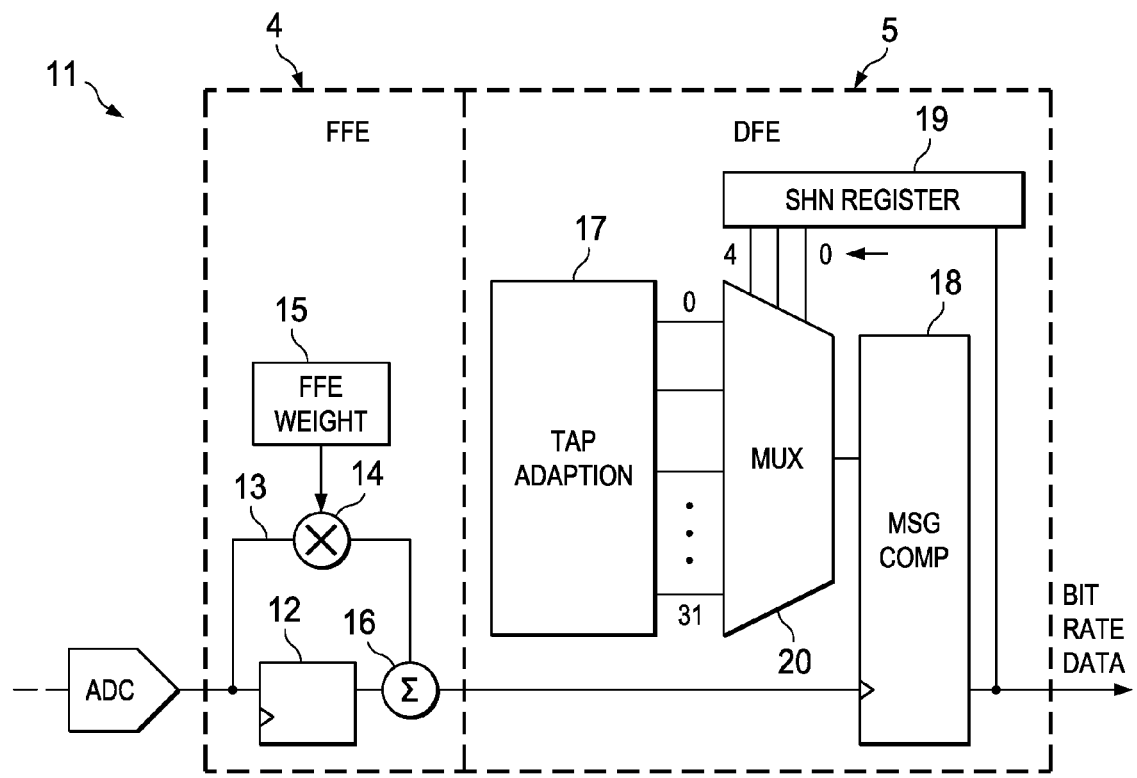
FIG. 2 shows the feed forward equaliser and the decision feedback equaliser of the receiver circuit of FIG. 1.

The digital samples output from the ADCs 2 and 3 are interleaved and the resulting stream of samples is fed into a custom digital signal processing (DSP) data-path that performs the numerical feed-forward equalization and decision-feedback equalization. This is shown in FIG. 2. This comprises a 1 UI delay register 12 connected to receive the stream of samples from the ADCs 2 and 3. (1 UI is a period of the clock, i.e. the delay between bits.) A tap 13 also feeds the samples from the ADCs to a multiplier 14, each sample being received by the delay latch 12 and the multiplier 14 at the same time. The multiplier 14 multiplies each sample by a constant weight value (held in a programmable register 15), which value is typically 10%. The outputs of the multiplier 14 and the delay register 12 are added together by an adder 16 to provide the output of the FFE 4.

The digital FFE/DFE is implemented using standard 65 nm library gates.

An advantage of applying the equalization digitally is that it is straightforward to include feed-forward equalization as a delay-and-add function without any noise-sensitive analogue delay elements. The FFE tap weight is selected before use to compensate for pre-cursor ISI and can be bypassed to reduce latency. Whilst many standards require pre-cursor de-emphasis at the transmitter, inclusion at the receiver allows improved bit error rate (BER) performance with existing legacy transmitters.

The DFE 5 uses an unrolled non-linear cancellation method ["Techniques for High-Speed implementation of Non-linear cancellation" S. Kasturia *IEEE Journal on selected areas in Communications*. June 1991]. The data output (i.e. the 1s and 0s originally transmitted) is the result of a magnitude comparison between the output of the FFE 4 and a slicer-level dynamically selected from a set stored in a set 17 of pre-programmed registers. The values are determined by a control circuit (not shown in FIG. 1) from the waveforms of test patterns sent during a setup phase of operation. The magnitude comparison is performed by a magnitude comparator 18 connected to receive the output of the FFE 4 and the selected slicer-level; it outputs a 1 if the former is higher than the latter and a 0 if it is lower or equal, thereby forming the output of the DFE 5.

The slicer-level is selected from one of 2n possible options depending on the previous n bits of data history. The history of the bits produced by the magnitude comparator 18 is recorded by a shift register 19 which is connected to shift them in. The parallel output of the shift register is connected to the select input of a multiplexer 20 whose data inputs are connected to the outputs of respective ones of the set 17 of registers holding the possible slicer-levels.

Unrolled tap adaption is performed using a least mean square (LMS) method where the optimum slicing level is defined to be the average of the two possible symbol amplitudes (+/−1) when proceeded by identical history bits. (For symmetry the symbols on the channel for the bit values 1 and 0 are given the values +1 and −1).

Although 5-taps of DFE were chosen for this implementation, this parameter is easily scaleable and performance can be traded-off against power consumption and die area. In addition, the digital equalizer is testable using standard ATPG (automatic test pattern generation) and circular built-in-self-test approaches.

Figure 3:
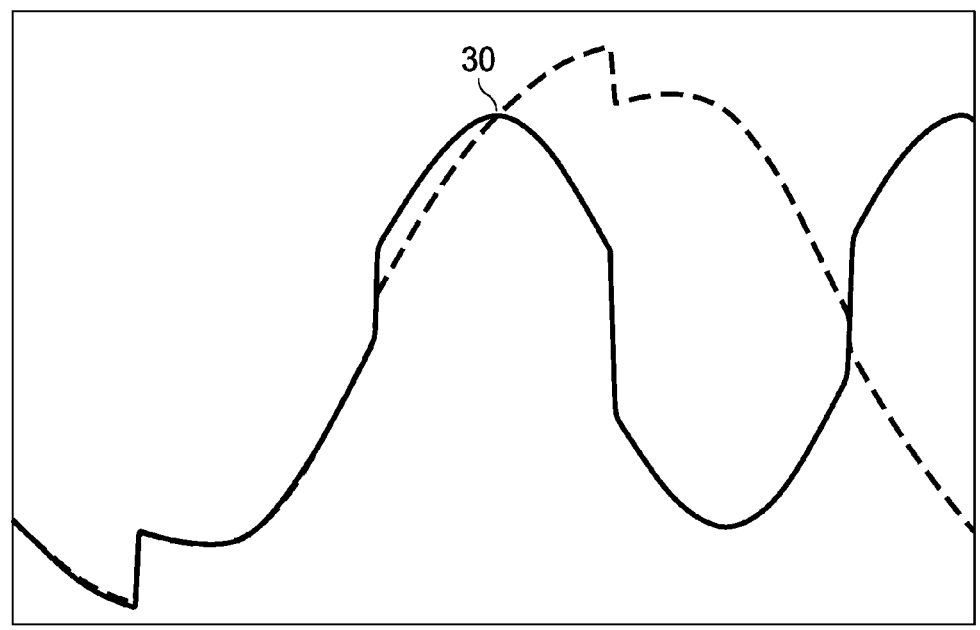
FIG. 3 is a graph showing the post equalised signal amplitude for exemplary bit patterns.

The chosen clock recovery approach uses a Muller-Mueller approach ["Timing recovery in Digital Synchronous Data Receivers" Mueller and Muller *IEEE Transactions on Communications* May 1976.] where the timing function adapts the T/H sample position to the point where the calculated pre-cursor inter-symbol interference (ISI) or h(−1) is zero, an example being given in FIG. 3. The two curves show the post-equalized response for 010 and 011 data sequences respectively. The intersection 30 at 3440 ps occurs when the sample of the second bit is independent of the third bit—that is, h(−1)=0. This position can be detected by comparing the post-equalized symbol amplitude with the theoretical amplitude h(0) and using the difference to update the CDR's phase-interpolator.

Figure 4:
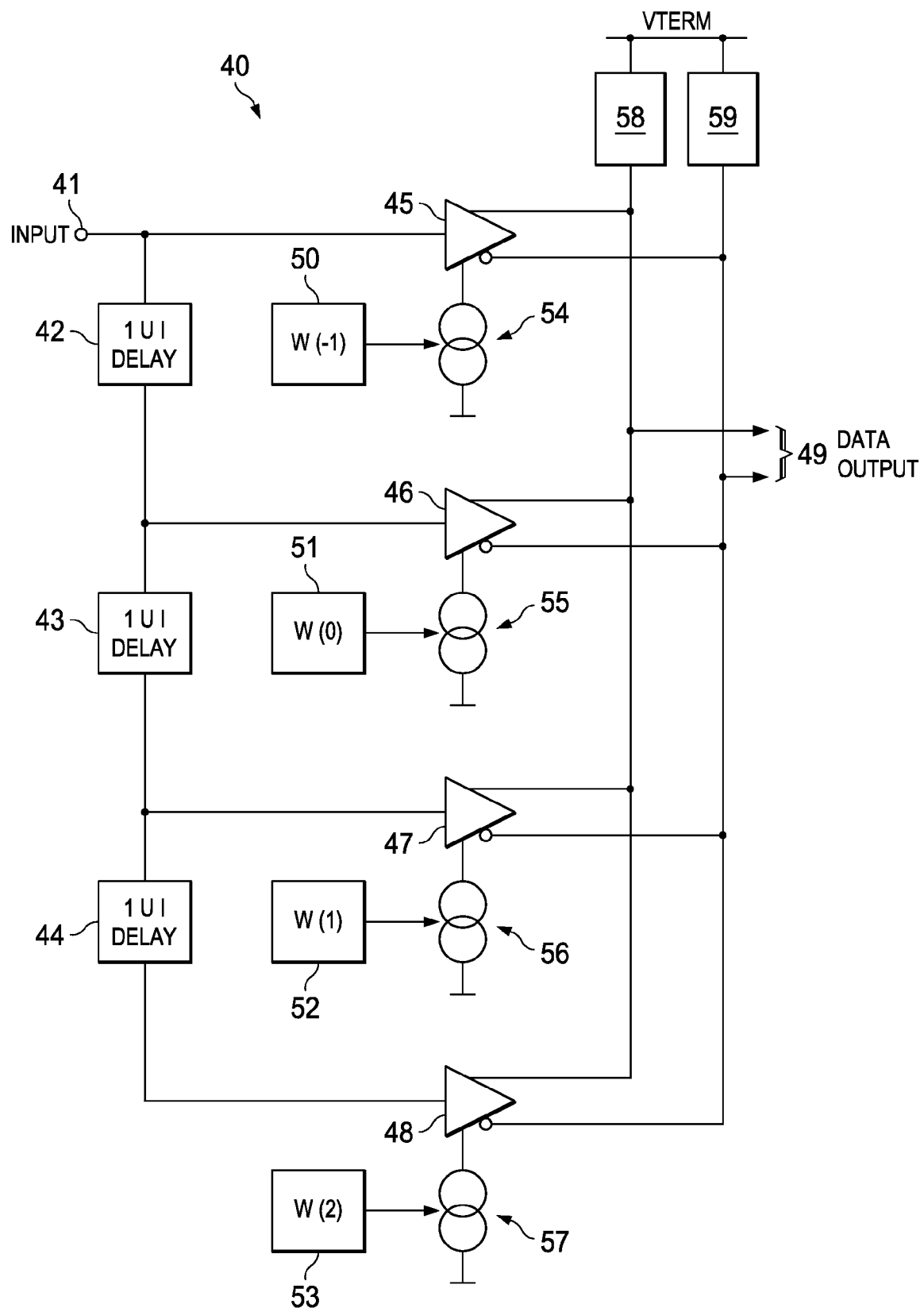
FIG. 4 is a diagram of a transmitter.

A block diagram of the transmitter is shown in FIG. 4, which is implemented using CML techniques. The data to be transmitted (received at terminal 41) is sequentially delayed by three 1 UI delay registers 42, 43 and 44 connected in series. They produce, via the four taps before and after each delay, a nibble-wide word containing the pre-cursor, cursor and two post-cursor components. In fact to ease timing closure the data is sent to the transmitter from the digital part of the circuit that supplies the data in blocks of 4 nibbles (16 bits in parallel), the blocks being sent at a rate of 3.125/s. Each nibble is a frame of four bits of the bitstream offset by one bit from the next so the nibbles overlap and represent the data redundantly. A multiplexer then selects one of the nibbles, switching between them at a rate of $12.5 \times 10^9$/s, and presents that in parallel to the four taps, thereby making the bitstream appear to advance along the taps.

A 4-tap FIR output waveform is obtained from simple current summing of the time-delayed contributions. This is done with differential amplifiers 45 to 48, each having its inputs connected to a respective one of the taps and having its differential output connected to a common differential output 49. Although shown as four differential amplifiers the circuit is implemented as one differential amplifier with four inputs, which minimizes return-loss. The relative amplitude of each contribution is weighted to allow the FIR coefficients to be optimized for a given circuit (e.g. a backplane) and minimize the overall residual ISI. The weights are determined empirically either for a typical example of a particular backplane or once a backplane is populated and are stored in registers 50 to 53. The weights respectively control the controllable driving current sources 54 to 57 of the differential amplifiers 45 to 48 to scale their output current accordingly. Respective pull-up resistors 58 and 59 are connected to the two terminals of the differential output 49.

A PLL is used to generate low-jitter reference clocks for the transmitter and receiver to meet standards ["OIF-CEI-02.0—Common Electrical I/O (CEI)—Electrical and Jitter Interoperability agreements for 6G+ bps and 11G+ bps I/O". *Optical Internetworking Forum*, February 2005; "IEEE Draft 802.3ap/Draft 3.0—Amendment: Electrical Ethernet Operation over Electrical Backplanes" *IEEE* July 2006.]. Most integrated circuits will have more than one receiver 1 and the PLL is shared between them with each receiver having a phase interpolator to set the phase to that of incoming data.

The PLL uses a ring oscillator to produce four clock-phases at a quarter of the line data-rate. The lower speed clocks allow power efficient clock distribution using CMOS logic levels, but need duty-cycle and quadrature correction at the point of use. The 3.125 GHz clocks are frequency doubled (XOR function) to provide the 6.25 GHz clock for the T/H &

ADC. The transmitter uses the four separate 3.125 GHz-phases, but they require accurate alignment to meet jitter specifications of 0.15UI p-p R. J. and 0.15UI p-p D. J.

The system described has been fabricated using a 65 nm CMOS process and has been shown to provide error-free operation at 12.5 Gb/s over short channels (two 11 mm package traces, 30 cm low-loss PCB and two connectors). A legacy channel with −24 dB of attenuation at 3.75 GHz supports error free operation at 7.5 Gb/s.

Figure 5A:
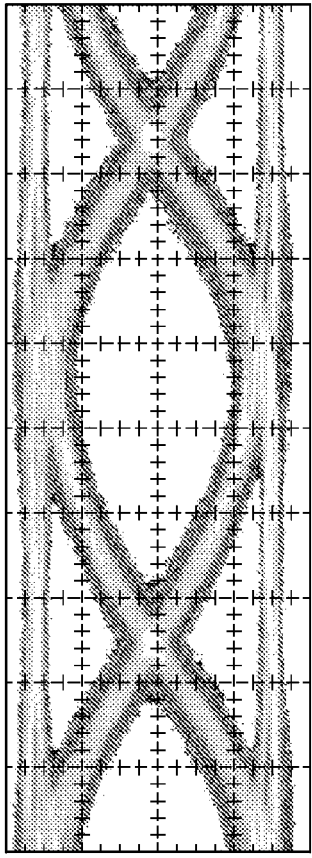
FIG. 5a shows the response of the receiver to a PRBS transmitted eye-pattern.
Figure 5B:
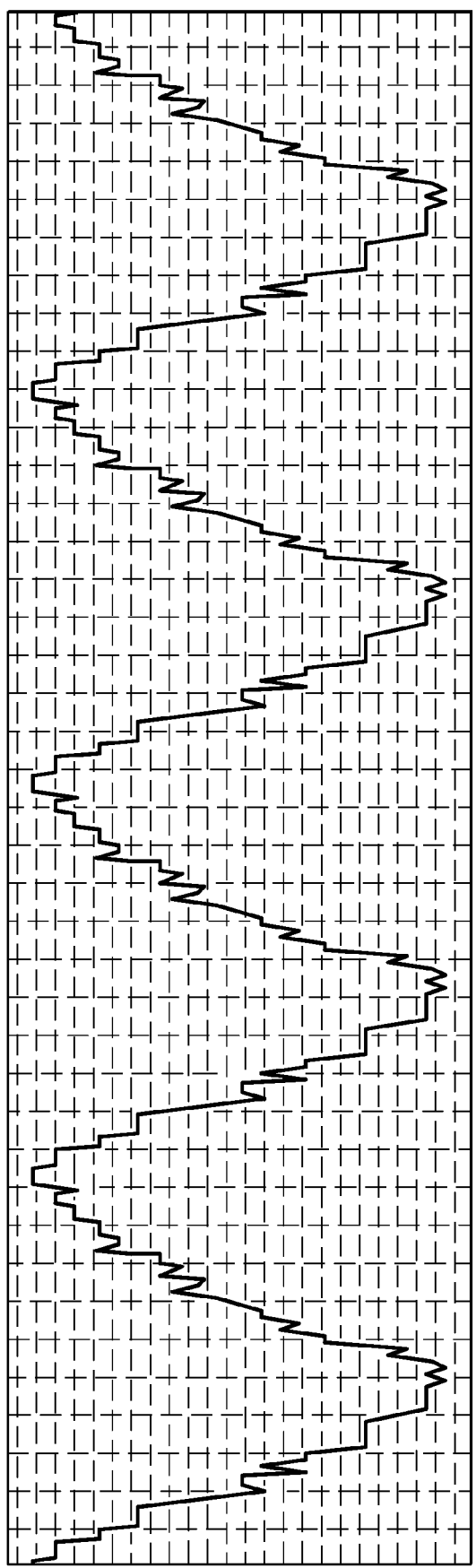
FIG. 5b shows the interleaved output of the ADCs of the receiver.

FIG. 5a shows a 12.5 Gb/s 27-1 pseudo random bit stream (PRBS) transmitted eye-pattern with 20% de-emphasis on the first post-cursor. The receiver includes, for test purposes, a PRBS data verifier 66, which confirms that the test pattern has been received. The differential peak-to-peak (pp) amplitude is 700 mV (200 mV/div). FIG. 5b shows the ADC output when a 6.25 GHz sine-wave is sampled and the phase between the sine-wave and receiver is incremented using a programmable delay-line. The measured codes are within +/−1 lsb (least significant bit) of the expected values. This level of performance ensures robust operation over a wide range of cables, green-field and legacy channels. The worst-case power of a single TX/RX pair, or "lane" is 330 mW and the total exemplary macro area is 0.45 mm² per lane (allowing for the PLL being shared by four TX/RX lanes).

Figure 6:
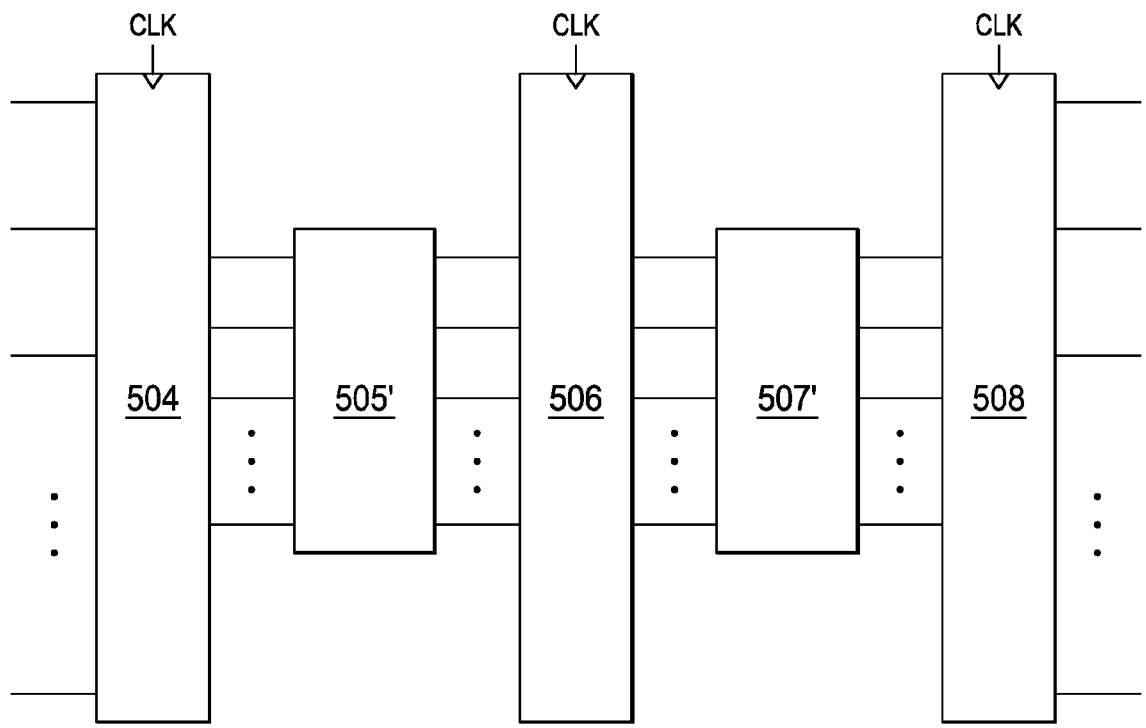
FIG. 6 is a block diagram of a thermometer code to sign and magnitude code converter in accordance with the invention.

FIG. 6 is a block diagram of a thermometer code to sign and magnitude code converter) in accordance with the invention, which can be used in each of the ADCs 2 and 3 of the SerDes receiver circuit of FIG. 1. Generally this is the same as the flash ADC described above as an example of known flash ADC and similar components have been marked with the similar reference numerals.

In this example a first modification is to the thermometer code to Gray code converter 505, which accordingly has been labelled 505'. This is arranged to provide a different form of $2^N$ bit Gray code.

TABLE 2

| Thermometer Code | Gray code | Sign & magnitude binary code | Signal level* |
|---|---|---|---|
| tttttttttttttttt | | | |
| 1111100000000000 | gggg | smmm | |
| 432109876543210 | 3210 | 210 | |
| 1111111111111111 | 0100 | 0111 | +7.5 |
| 0111111111111111 | 0101 | 0110 | +6.5 |
| 0011111111111111 | 0111 | 0101 | +5.5 |
| 0001111111111111 | 0110 | 0100 | +4.5 |
| 0000111111111111 | 0010 | 0011 | +3.5 |
| 0000011111111111 | 0011 | 0010 | +2.5 |
| 0000001111111111 | 0001 | 0001 | +1.5 |
| 0000000111111111 | 0000 | 0000 | +0.5 |
| 0000000011111111 | 1000 | 1000 | −0.5 |
| 0000000001111111 | 1001 | 1001 | −1.5 |
| 0000000000111111 | 1011 | 1010 | −2.5 |
| 0000000000011111 | 1010 | 1011 | −3.5 |
| 0000000000001111 | 1110 | 1100 | −4.5 |
| 0000000000000111 | 1111 | 1101 | −5.5 |
| 0000000000000011 | 1101 | 1110 | −6.5 |
| 0000000000000001 | 1100 | 1111 | −7.5 |
| 0000000000000000 | | | |

$t_i$, $g_i$ and s and $m_i$ are labels for the individual bits of the codes.
*taking a unit interval between states of the thermometer code and also the zero level to be between codes 0000 and 1000.

In this new Gray code, compared to that in Table 1, the first $2^{N-1}$ codes (from 0000 up) have been moved up $2^{N-1}$ places and the second $2^{N-1}$ codes have been moved down $2^{N-1}$ places ($2^{N-1}=8$ in this case).

Again the Gray code has the property that in moving from one code to the next only one of the bits changes in value so if one of the bits between the boundary between the 1s and the 0s in the thermometer code takes a long time to settle or is unstable, then that only causes an instability of the output of the converter 505' that affect the value of the Gray code by one unit, i.e. the Gray code switches between adjacent codes in Table 2.

Figure 7:
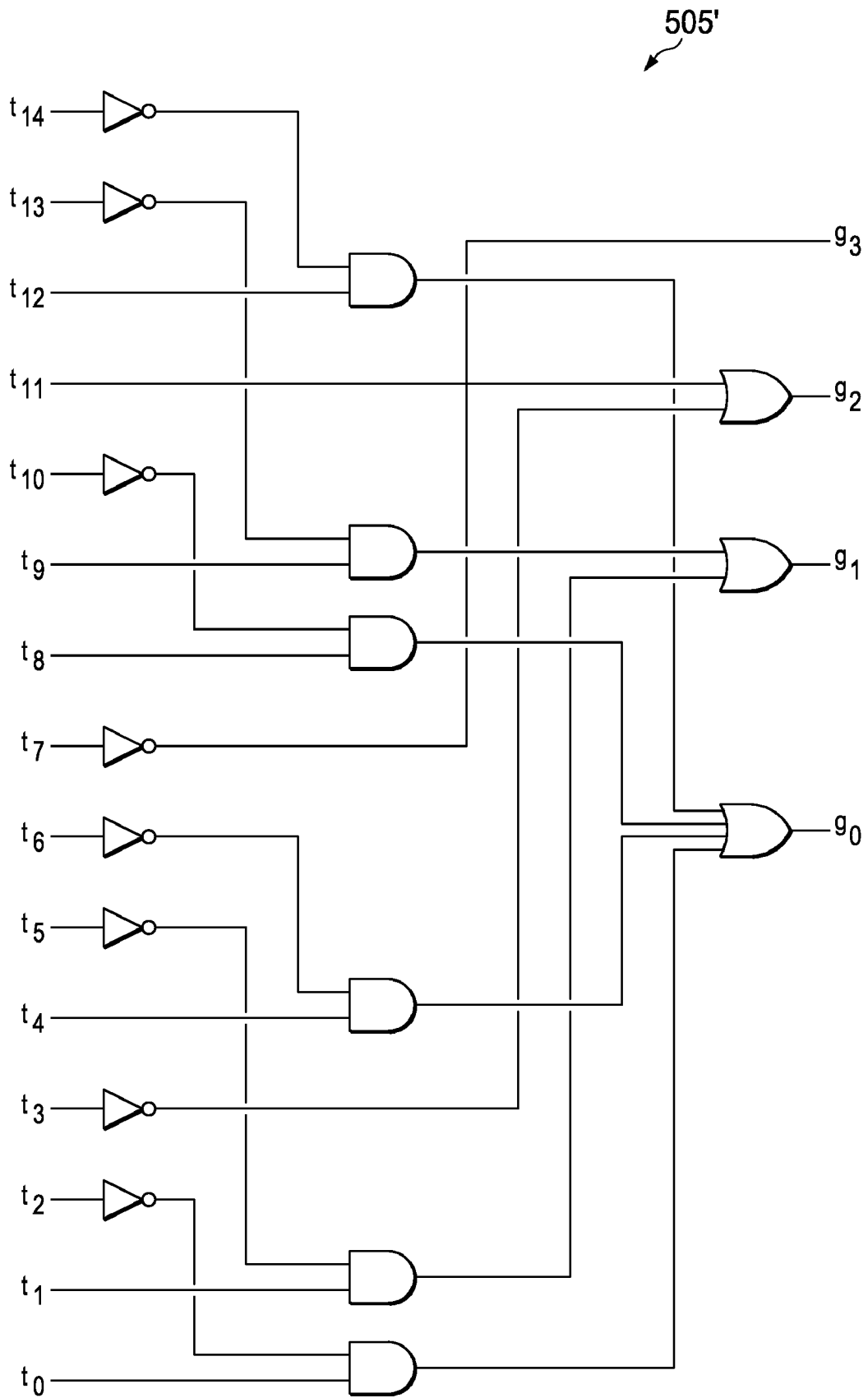
FIG. 7 is a circuit diagram of a preferred implementation of the thermometer code to Gray code converter of circuit of FIG. 6.

The logic operations performed by the thermometer to Gray code converter 505' are as follows:

$$g_3 = \sim t_7$$

$$g_2 = \sim t_3 + t_{11}$$

$$g_1 = (t_1 \ \& \sim t_5) + (t_9 \ \& \sim t_{13})$$

$$g_0 = (t_0 \ \& \sim t_2) + (t_4 \ \& \sim t_6) + (t_8 \ \& \sim t_{10}) + (t_{12} \ \& \sim t_{14})$$

where $g_i$ is the i'th bit of the Gray code (i=0 to N−1) and $t_j$ is the j'th bit of the thermometer code (j=0 to $2^N-2$), + is the logical OR operation, & is the logical AND operation and ~ is the logical NOT operation. The logic gates of the converter 505' performing those logic functions is shown in FIG. 7.

The leftmost bit of the Gray code in the Table is simply produced from the bit of the thermometer code bit that changes at the same time. Although where in the Table or otherwise the Gray code that represents a signal level of zero is an arbitrary choice, for reasons which will become clear, the leftmost bit of the Gray code can usefully be thought of a sign bit, and as can be seen all the codes below 0000 have this set to 1 and all above (and code 0000 itself) have it set to 0. The next leftmost bit of the Gray code is produced by ORing together thermometer code bits $(2^{N-1})-1\pm(2^{N-2})$. For the other bits, i, of the Gray code the equations are formed by locating neighbouring pairs of the places where the i'th bit of the Gray code changes and then finding for each pair the two bits of the thermometer code that change in corresponding places and ANDing those two bits together, the higher index one of those two bits of the thermometer code being inverted first. The results of all those ANDs are ORed together. The $2^{N-2-i}$ terms (indexed as k=0 to $2^{N-2-i}-1$) that ORed together for $g_i$ can each be expressed as:

$$t(k2^{2+i}) \text{ OR NOT } t(k2^{2+i}+2^{1+i}), \text{ where } t(q) \text{ is } t_q$$

Clearly it would be possible to arrange that the thermometer code was of the kind having 0s as the least significant bits and is as the most significant bits. For this code the equations above hold but each value of $t_i$ needs to be inverted.

Figure 9:
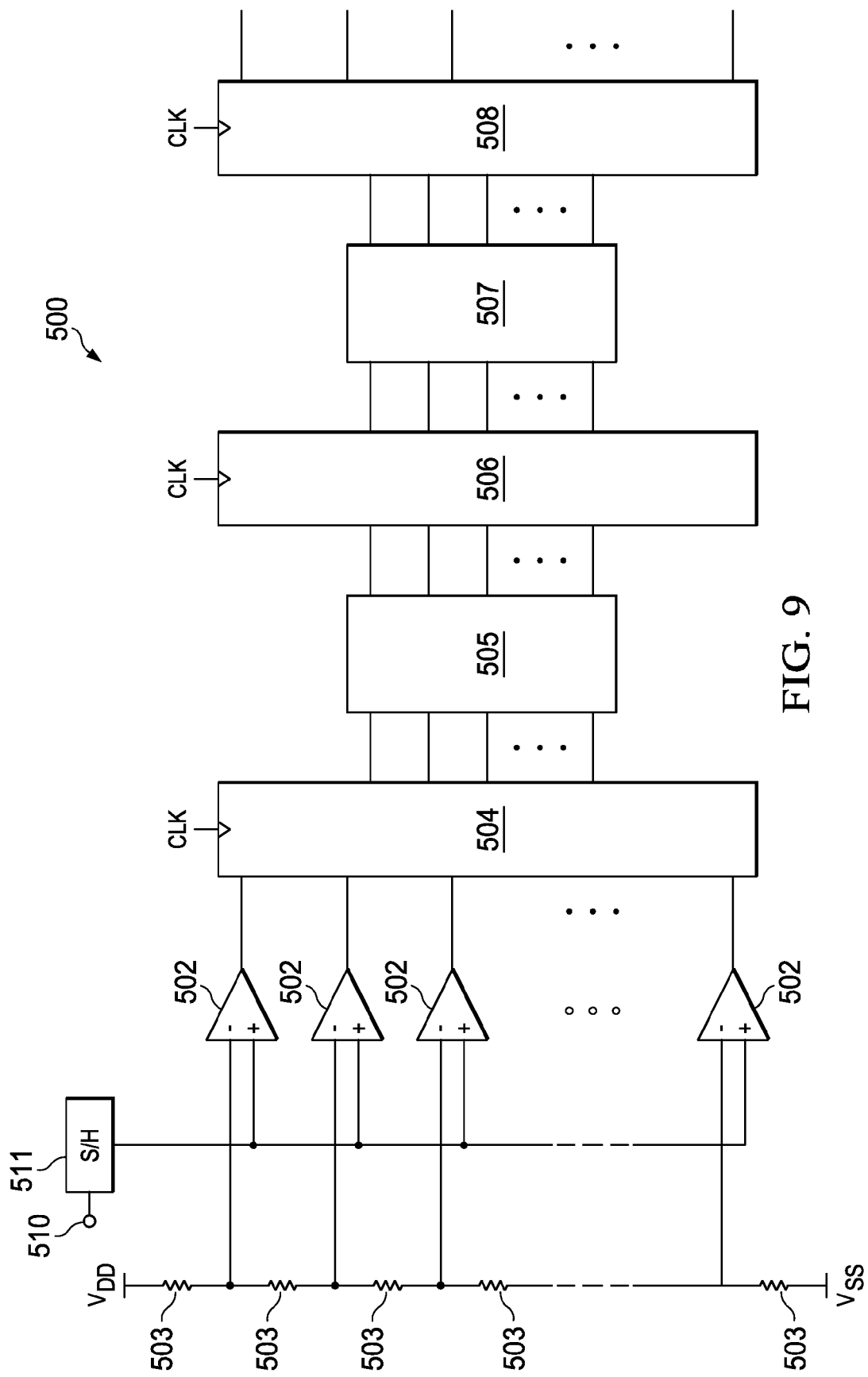
FIG. 9 is a block diagram of a known ADC having a thermometer code to binary converter.

A second modification, compared to the circuit FIG. 9, is to the Gray code to binary logic block 507 which is replaced by to a Gray code to sign and magnitude logic block, labelled 507' accordingly. The logic operations performed by converter 507' are as follows:

$$s = g_3$$

$$m_2 = g_2$$

$$m_1 = g_2 \text{ XOR } g_1$$

$$m_0 = g_2 \text{ XOR } g_1 \text{ XOR } g_0 (=m_1 \text{ XOR } g_0)$$

where XOR is the logical exclusive or operation.

Figure 8:
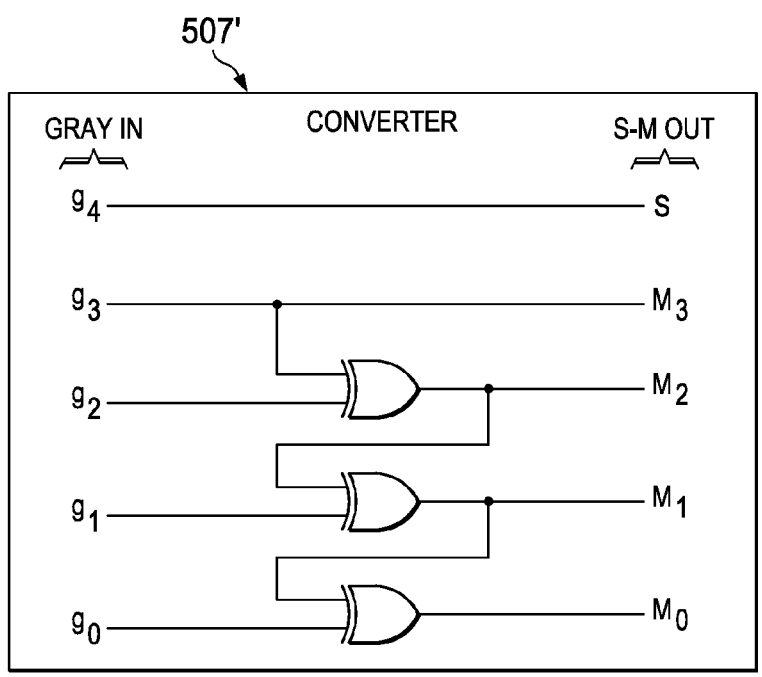
FIG. 8 is a circuit diagram of a preferred implementation of Gray code to sign and magnitude converter of circuit of FIG. 6.

The logic gates of the that perform those operations is shown in FIG. 8.

For the more general case of the circuit of FIG. 6 where there are N bits in the Gray code (indexed 0 to N−1), $2^N1$ bits in the thermometer code and N bits in the sign and magnitude code (one being the sign bit and the magnitude bits indexed 0 to N−2) these equations can be generalised to:

$$s = g_{N-1}$$

$$m_{N-2} = g_{N-2}$$

$$m_{(\text{for } i=0 \text{ to } N-3)} = XOR \text{ of } g_i \text{ to } g_{N-1}$$

All the logic operations above for the converters 505' and 507' are constructed from standard logic gates in the manner well known to the skilled person: either by directly using an AND gate for each AND operation above etc, or by using different combinations of gates which provide the same output.

Note that for $m_i$, for i=0 to M−2, $m_i$ the result is simplified (as exemplified by the bracketed portion of the equation for $m_0$) if it is calculated based on $m_{i+1}$. This means a reduction in the number of logic gates used in the circuit is obtained by using the output of the $m_{i+1}$ as the input to the gates that calculate $m_i$. (The circuit of FIG. 8 is implemented in this way.)

The advantage of this exemplary circuit is that, as will be seen from the equations for bits sign and magnitude code, the circuitry for the conversion from Gray code to sign and magnitude code is very simple, compared for example to that needed for conversion from ordinary Gray code to binary, and so suffers from very little propagation delay. (The simplicity of the task is also apparent if one compares the codes of the Gray code to that of the sign and magnitude from which it will be seen that for each value the two codes are quite similar, in fact identical for those near 0000.) The means that the period available for the output of logic block 507' to settle is correspondingly extended. This is particularly useful at high bit rates and where it is desired to reduce the latency between a value becoming available as a thermometer code and the resultant number being available in a binary form.

The circuit of FIG. 6 provides its output in sign and magnitude form, so consequently circuits downstream of the circuit of FIG. 6 will need to be constructed in a form that can process numbers in that form. For example, if the present invention were to be used in the circuit of FIGS. 1 and 2 the multiplier 14, the adder 16 and the magnitude comparator 18 will need to be so constructed. In constructing those circuits it should be borne in mind that there is a unit interval between the codes 0000 and 1000 in terms of the signal represented (i.e. the level of the input analog signal in the exemplary case above of the flash ADC).

Alternatively the output of the circuit of FIG. 6 could be converted to ordinary binary or twos-complement form, which are perhaps more often used, but that would introduce considerable latency.

Another example of the invention is given in Table 3. The circuit is the same as FIG. 6 but the number of bits is greater. This example also addresses the issue of how to deal with cases where there are a number of states of the thermometer code that is not equal to $2^N$, where N is an integer.

As can be seen from the table 2, this example is for the case where N=5 and there are 32 states of the thermometer code (for now the dotted lines should be ignored). Again the Gray code is formed by taking the reflected Gray code and moving those codes starting with a 1 to below the all zero code, 0000, but without reversing, or otherwise changing their order.

TABLE 3

| Thermometer Code (31 bit) | | | Gray code | Sign & magnitude binary code |
|---|---|---|---|---|
| tttt 3222 | tttttttttttttttttttttt 2222222111111111000000 | tttt 0000 | ggggg | smmmm |

TABLE 3-continued

| Thermometer Code (31 bit) | | Gray code | Sign & magnitude binary code |
|---|---|---|---|
| 0987 6543210987654321098 7654 | 3210 | 43210 | 3210 |
| 1111 1111111111111111111 1111 | 1111 | 01000 | 01111 |
| 0111 1111111111111111111 1111 | 1111 | 01001 | 01110 |
| 0011 1111111111111111111 1111 | 1111 | 01011 | 01101 |
| 0001 1111111111111111111 1111 | 1111 | 01010 | 01100 |
| 0000 1111111111111111111 1111 | 1111 | 01110 | 01011 |
| 0000 0111111111111111111 1111 | 1111 | 01111 | 01010 |
| 0000 0011111111111111111 1111 | 1111 | 01101 | 01001 |
| 0000 0001111111111111111 1111 | 1111 | 00100 | 01000 |
| 0000 0000111111111111111 1111 | 1111 | 00100 | 00111 |
| 0000 0000011111111111111 1111 | 1111 | 00101 | 00110 |
| 0000 0000001111111111111 1111 | 1111 | 00111 | 00101 |
| 0000 0000000111111111111 1111 | 1111 | 00110 | 00100 |
| 0000 0000000011111111111 1111 | 1111 | 00010 | 00011 |
| 0000 0000000001111111111 1111 | 1111 | 00011 | 00010 |
| 0000 0000000000111111111 1111 | 1111 | 00001 | 00001 |
| 0000 0000000000011111111 1111 | 1111 | 00000 | 00000 |
| 0000 0000000000001111111 1111 | 1111 | 10000 | 10000 |
| 0000 0000000000000111111 1111 | 1111 | 10001 | 10001 |
| 0000 0000000000000011111 1111 | 1111 | 10011 | 10010 |
| 0000 0000000000000001111 1111 | 1111 | 10010 | 10011 |
| 0000 0000000000000000111 1111 | 1111 | 10110 | 10100 |
| 0000 0000000000000000011 1111 | 1111 | 10111 | 10101 |
| 0000 0000000000000000001 1111 | 1111 | 10101 | 10110 |
| 0000 0000000000000000000 1111 | 1111 | 11100 | 10111 |
| 0000 0000000000000000000 0111 | 1111 | 11100 | 11000 |
| 0000 0000000000000000000 0011 | 1111 | 11101 | 11001 |
| 0000 0000000000000000000 0001 | 1111 | 11111 | 11010 |
| 0000 0000000000000000000 0000 | 1111 | 11110 | 11011 |
| 0000 0000000000000000000 0000 | 0111 | 11010 | 11100 |
| 0000 0000000000000000000 0000 | 0011 | 11011 | 11101 |
| 0000 0000000000000000000 0000 | 0001 | 11001 | 11110 |
| 0000 0000000000000000000 0000 | 0000 | 11000 | 11111 |
| tttttttttttttttttttttttt 222111111111100000000 210987654321094765 43210 Thermometer Code (15 bit) | | | |

The circuit remains as shown in FIG. 6 except there are a greater number of bits in the codes; the bits of the Gray code are generated by the converter 505' according to the general equations given above using N=5, and similarly converter 507' generates the sign and magnitude code in accordance with them using N=5.

Table 3 also shows how examples having a number of states not equal to $2^N$ where N is not an integer. The portion of the thermometer code table surrounded by a dotted box is a thermometer code of 23 bits having 24 states (i.e. N would be between 4 and 5. In this third example the thermometer code input to the converter 505' has 23 inputs but still arranged to provide a 5 bit Gray code but only those codes between the upper and lower horizontal dotted lines in the table. The circuitry is still generally in accordance with the general equations above for N=5 but since the codes outside the dotted lines need not be produced the equations can be simplified taking the bits of the thermometer code to the left of the left dotted line in the table always to be 0 and those to the right of the right dotted line to be 1. The circuitry is then, preferably for reasons of gate count and propagation time) constructed in accordance with the simplified equations. For this third example the general equations for the converter 505' reduce to the following (labelling the thermometer code bit t0 to t22 as shown in the last row of the table):

$g_4 = \sim t_{11}$ $g_3 = \sim t_3 + t_{19}$ $g_2 = \sim t_7 + t_{15}$ $g_1 = \sim t_1 + (t_5 \ \& \sim t_9) + (t_{13} \ \& \sim t_{17}) + t_{21}$ $g_0 = (t_0 + \sim t_2) + (t_4 \ \& \sim t_6) + (t_8 \ \& \sim t_{10}) + (t_{12} \ \& \sim t_{14}) + (t_{16} \ \& \sim t_{18}) + (t_{20} \ \& \sim t_{22})$ The converter 505' is constructed from logic gates to provide those logic functions.

In the 24 state third example the converter 507' is the same as in the 32 state second example, since it converts a five bit Gray code to a five bit sign and magnitude code. The general equations above for the converter 507' for these two example for N=5 are:

$s = g_4$ $m_3 = g_3$ $m_2 = g_3 \text{ XOR } g_2$ $m_1 = g_3 \text{ XOR } g_2 \text{ XOR } g_1 (= m_2 \text{ XOR } g_1)$ $m_0 = g_3 \text{ XOR } g_2 \text{ XOR } g_1 \text{ XOR } g_0 (= m_1 \text{ XOR } g_0)$ The converter 507' is constructed from logic gates to provide those logic functions.

In the above examples there equal numbers of Gray codes starting with a 1 and a 0. If this is not desired for some reason then it is not essential to have equal numbers and the equations for calculating the thermometer code to Gray code conversion can be determined using the procedure above for where the number of codes is not equal to $2^N$, N being an integer, i.e. by determining which of the thermometer code bits in the table are not used and hence are constant. (Imagine the horizontal dotted lines in table 2 not being in symmetric positions about codes 00000 and 10000.)

The example of FIG. 6 concerns in particular the conversion of a thermometer code to a sign and magnitude code in the exemplary context of an ADC converter, however there will be other applications in which such a conversion would be useful. Further, in some of those applications the registers 504, 506 and 508 are not be needed and so can be omitted, the output of converter 505' being connected to the input of converter 507'. Another aspect of the use of the invention in ADC circuits is that the all 1 and all 0 codes indicate the special condition that the analogue signal is outside the measurable range. It may be that these are separately recognised to cause error signals to be generated.

There are in fact many more Gray code sets than those shown in the tables above, which are of course preferred examples. (In the examples the Gray codes used are a variant on the reflected Gray code, which is produced by changing the rightmost bit is changed if that can be done without repeating one of the other codes—other Gray codes do not follow the change the rightmost rule.) In principle, within the invention, the thermometer to Gray code converter could be arranged to produce any Gray, but for many purposes codes of the kind of the examples are to be preferred because of the simplicity of the circuitry that is needed to implement the two converters. The variations on those preferred codes of inverting one or more of the Gray code bits or permuting two or more of the columns will also have converters that are quite simple.

Should another code be used, logic circuits providing the converters 505' and 507' can be found using standard methods known to the skilled person.

Using a Gray code with a sign bit, or equivalently stated, a gray code in which for a particular bit, when the codes are ordered by magnitude, there is exactly one block of the codes for which that bit is a 0 and exactly one block of the codes for which that bit is a 1 (again which of the 1 and 0 block is higher than the other is an arbitrary choice), is to be preferred because then no gates, or just an inverter, are used to convert the Gray code sign bit to the sign and magnitude sign bit.

Once there is a sign bit it will generally be preferable to have the other bits of the Gray code so that for two the codes are the same distance from the boundary where the sign bit changes those other bits are the same. This simplifies the set of gates needed to convert those bits to the magnitude of the sign and magnitude representation (since the sign bit will not be an input for those gates).

What is claimed is:

1. A thermometer code to sign and magnitude code converter circuit comprising:
   a thermometer code to Gray code converter having a thermometer code input and a Gray code output, and
   a Gray code to sign and magnitude code converter having a Gray code input connected to the Gray code output of the thermometer code to Gray code converter and having sign bit and magnitude outputs, wherein the thermometer code to Gray code converter is arranged to produce a Gray code that has a sign bit amongst its bits.

2. A converter as claimed in claim 1 wherein the Gray code to sign and magnitude converter is arranged to pass through or invert the sign bit of the output of the thermometer code to Gray code converter to provide the sign bit output of the Gray code to sign and magnitude converter.

3. A converter as claimed in claim 1 wherein the Gray code to sign and magnitude converter is arranged to produce for the bits of its output other than the sign bit the same code for the Gray codes that are the same distance from the boundary where the sign bit changes value when the Gray codes are arranged in order of their value.

4. A converter as claimed in claim 3 wherein the thermometer code to Gray code converter is arranged to produce codes for bits of its output other than the sign bit that are the reflected Gray code.

5. A converter as claimed in claim 1 wherein the thermometer code to Gray code converter is arranged to produce a code consisting of all zeros for a particular thermometer code that is neither the thermometer code of all ones or zeros.

6. An analog to digital converter comprising:
   a converter connected to convert an analog signal to a thermometer code;
   a thermometer code to Gray code converter having a thermometer code input connected to receive the thermometer code and a Gray code output,
   a Gray code to sign and magnitude code converter having a Gray code input connected to the Gray code output of the thermometer code to Gray code converter and having sign bit and magnitude outputs,
   a register connected to larch the output of the Gray code to sign and magnitude converter in response to a clock signal.

7. A converter as claimed in claim 6 wherein thermometer code to Gray code converter is arranged to produce a Gray code having 5 bits.

8. A converter as claimed in claim 1 wherein the register is connected to latch the output of the thermometer to Gray code converter in response to a clock signal and to present the latched value to the input of the Gray code to sign and magnitude converter.

9. A thermometer code to sign and magnitude code converter circuit comprising:
   a thermometer code to Gray code converter having a thermometer code input and a Gray code output,
   a Gray code to sign and magnitude code converter having a Gray code input connected to the Gray code output of the thermometer code to Gray code converter and having sign bit and magnitude outputs, and
   the register connected to present the thermometer code to the thermometer code to Gray code converter.

10. A converter as claimed in claim 9 wherein the register is connected to latch the output of the Gray code to sign and magnitude converter in response to a clock signal.

11. A converter as claimed in claim 9 wherein the thermometer code to Gray code converter comprises a plurality of AND gates each connected to AND together one respective bit of the thermometer code and another inverted different respective bit of the thermometer code, and at least one OR gate connected to OR together at least two of the outputs of the AND gates to provide a respective bit of the Gray code output.

12. A converter as claimed in claim 9 wherein the Gray code to sign and magnitude code converter comprises an XOR gate connected to XOR together two of the Gray code bits to produce one of the magnitude bits.

13. A converter as claimed in claim 12 wherein the Gray code to sign and magnitude code converter comprises an XOR gate connected to XOR together one of the magnitude bits of the magnitude output with one of the Gray code bits to produce another one of the magnitude bits.

14. A converter as claimed in claim 6 wherein thermometer code to Gray code converter is arranged to produce a Gray code having 4 bits.

15. A method of converting, using a circuit, a thermometer code to a sign and magnitude code comprising:
   converting the thermometer code to a Gray code,
   converting the resultant Gray code to a sign and magnitude code having a sign bit among its bits; and
   latching an output of the thermometer to Gray code converter in response to receiving a clock signal.

16. The method as claimed in claim 15 further comprising:
   presenting a latched value to an input of the Gray code to sign and magnitude converter.

17. The method as claimed in claim 15 further comprising producing for bits other than the sign bit the same code for the Gray codes that are the same distance from the boundary where the sign bit changes value when the Gray codes are arranged in order of their value.

18. The converter as claimed in claim 1 for use with an analog to digital converter.

19. The converter as claimed in claim 9 for use with an analog to digital converter.

* * * * *